US012799579B2

(12) United States Patent
Chen et al.

(10) Patent No.: US 12,799,579 B2
(45) Date of Patent: Nov. 17, 2026

(54) PASSIVATION LAYER FOR FORMING SEMICONDUCTOR BONDING STRUCTURE, SPUTTERING TARGET MAKING THE SAME, SEMICONDUCTOR BONDING STRUCTURE AND SEMICONDUCTOR BONDING PROCESS

(71) Applicant: SOLAR APPLIED MATERIALS TECHNOLOGY CORP., Tainan (TW)

(72) Inventors: Kuan-Neng Chen, Tainan (TW); Zhong-Jie Hong, Tainan (TW); Chih-I Cho, Tainan (TW); Ming-Wei Weng, Tainan (TW); Chih-Han Chen, Tainan (TW); Chiao-Yen Wang, Tainan (TW); Ying-Chan Hung, Tainan (TW); Hong-Yi Wu, Tainan (TW); Cheng-Yen Hsieh, Tainan (TW)

(73) Assignee: SOLAR APPLIED MATERIALS TECHNOLOGY CORP., Tainan (TW)

( * ) Notice: Subject to any disclaimer, the term of this patent is extended or adjusted under 35 U.S.C. 154(b) by 518 days.

(21) Appl. No.: 18/384,396

(22) Filed: Oct. 27, 2023

(65) Prior Publication Data

US 2024/0145421 A1 May 2, 2024

(30) Foreign Application Priority Data

Oct. 31, 2022 (TW) ................................. 111141456

(51) Int. Cl.

| | |
|---|---|
| ***C23C 14/18*** | (2006.01) |
| *H10W 72/00* | (2026.01) |
| *H10W 72/30* | (2026.01) |

(52) U.S. Cl.

CPC ..... *C23C 14/185* (2013.01); *H10W 72/01315* (2026.01); *H10W 72/07311* (2026.01);

(Continued)

(58) Field of Classification Search

CPC ........... H10W 72/00; H10W 72/01315; H10W 72/073; H10W 72/07311;

(Continued)

(56) References Cited

U.S. PATENT DOCUMENTS

| | | | | |
|---|---|---|---|---|
| 9,196,595 | B2 | 11/2015 | Chen et al. | |
| 2018/0218999 | A1* | 8/2018 | Gondcharton ...... | H10P 90/1914 |

(Continued)

FOREIGN PATENT DOCUMENTS

| | | | |
|---|---|---|---|
| CN | 107735319 | A | 2/2018 |
| CN | 111235425 | A | 6/2020 |

(Continued)

*Primary Examiner* — Brook Kebede

(74) *Attorney, Agent, or Firm* — WPAT, PC

(57) ABSTRACT

Provided are a passivation layer for forming a semiconductor bonding structure, a sputtering target making the same, a semiconductor bonding structure and a semiconductor bonding process. The passivation layer is formed on a bonding substrate by sputtering the sputtering target; the passivation layer and the sputtering target comprise a first metal, a second metal or a combination thereof. The bonding substrate comprises a third metal. Based on a total atom number of the surface of the passivation layer, O content of the surface of the passivation layer is less than 30 at %; the third metal content of the surface of the passivation layer is less than or equal to 10 at %. The passivation layer has a polycrystalline structure. The semiconductor bonding structure sequentially comprises a first bonding substrate, a bonding layer and a second bonding substrate: the bonding layer is mainly formed by the passivation layer and the third metal.

16 Claims, 12 Drawing Sheets

(52) U.S. Cl.
CPC .... *H10W 72/07332* (2026.01); *H10W 72/352* (2026.01); *H10W 72/355* (2026.01)

(58) Field of Classification Search
CPC ........... H10W 72/07332; H10W 72/30; H10W 72/352; H10W 72/355; C23C 14/165; C23C 14/18; C23C 14/185
See application file for complete search history.

(56) References Cited

U.S. PATENT DOCUMENTS

| | | | | |
|---|---|---|---|---|
| 2020/0006275 | A1* | 1/2020 | Chen | H10W 72/073 |
| 2021/0335745 | A1* | 10/2021 | Chen | H10P 90/1914 |

FOREIGN PATENT DOCUMENTS

| | | | |
|---|---|---|---|
| TW | 200417617 | A | 9/2004 |
| TW | I409352 | B | 9/2013 |
| TW | 201606099 | A | 2/2016 |
| TW | 201704486 | A | 2/2017 |
| TW | I608108 | B | 12/2017 |
| TW | I613305 | B | 2/2018 |
| TW | I645052 | B | 12/2018 |

* cited by examiner

PASSIVATION LAYER FOR FORMING SEMICONDUCTOR BONDING STRUCTURE, SPUTTERING TARGET MAKING THE SAME, SEMICONDUCTOR BONDING STRUCTURE AND SEMICONDUCTOR BONDING PROCESS

CROSS-REFERENCE TO RELATED APPLICATION

Pursuant to 35 U.S.C. § 119(a), this application claims the benefits of the priority to Taiwan Patent Application No. 111141456, filed Oct. 31, 2022. The contents of the prior application are incorporated herein by its entirety. BACKGROUND OF THE INVENTION

1. FIELD OF THE INVENTION

The instant disclosure relates to a passivation layer, particularly to a passivation layer for the semiconductor industry. In addition, the instant disclosure also relates to a semiconductor bonding structure, a semiconductor bonding process and a sputtering target for making the passivation layer.

2. DESCRIPTION OF THE PRIOR ARTS

In order to pursue higher performance and lower cost in the development of semiconductor processing technology, the node which indicates the transistor dimension is shrinking continuously, and the technological development has almost reached its limit. Heterogeneous Integration (HI) is another way to improve performance and has become a hot topic in the semiconductor industry in recent years. The connection between various heterogeneous components is formed through a bonding process, and the connection is a key factor affecting whether the component functionality can be fully exerted. However, when the number of components increases during the HL, heterogeneous components may not tolerate multiple and high-temperature bonding processes. Therefore, excessively high bonding temperatures in the latter bonding step may cause the failure of the previous bonding. In addition, since the bonding pitch continues to decrease and each contact area between metal joints becomes smaller, it is very sensitive to oxidation of the contact surface.

Metal bonding technology can provide an excellent electrical performance while maintaining mechanical strength, so it is a main choice for the bonding process. Since the interconnection lead in the chips is metal (such as copper), the preferred material of the metal pillars for the metal bonding will select the same metal material. However, metals are easily oxidized, and the resulting oxides not only hinder bonding but also increase contact resistance between bonding pillars after a completion of bonding. Therefore, there is still a need to develop a low-temperature metal bonding process that can achieve high quality and high yield.

SUMMARY OF THE INVENTION

In view of the drawbacks in the prior art, an objective of the instant disclosure is to provide a passivation layer which can cover the surface of the bonding substrate to prevent oxidation before bonding process, and to ensure the metal atoms of the bonding substrate to diffuse in a sufficient amount during the bonding process to form the bonding structure with sufficient bonding strength and conductivity.

Another objective of the instant disclosure is to provide a passivation layer by which the bonding structure can be formed under a low bonding temperature (such as a temperature lower than 200° C.).

To achieve the foresaid objectives, the instant disclosure provides a passivation layer for forming a semiconductor bonding structure and the passivation layer is formed on a bonding substrate. A material of the passivation layer comprises a first metal, a second metal or a combination thereof; wherein the first metal is gold (Au), silver (Ag), platinum (Pt), ruthenium (Ru), aluminum (Al) or any combination thereof; the second metal is copper (Cu), palladium (Pd) or a combination thereof. A material of the bonding substrate comprises a third metal which is Au, Al, Cu, cobalt (Co), Ru or any combination thereof. Based on a total atom number of a surface of the passivation layer, an Oxygen (O) content of the surface of the passivation layer is less than 30 atomic percent (at %), and a content of the material of the bonding substrate of the surface of the passivation layer is less than or equal to 10 at %. The passivation layer has a polycrystalline structure.

The passivation layer of the instant disclosure has the following technical features that: (I) the passivation layer should include the specific first metal and/or second metal; (II) the O content range of the surface of the passivation layer should be controlled; (III) the content range of the material of the bonding substrate of the surface of the passivation layer should be controlled; and (IV) the passivation layer has a polycrystalline structure. With said technical features, the passivation layer can prevent the metal atoms of the metal bonding substrate from excessively diffusing to the surface of the passivation layer before the bonding process, which causes the premature oxidation of the bonding face. Besides, since the passivation layer has the polycrystalline structure instead of amorphous oxide, the metal atoms of the bonding substrate can easily diffuse from the grain boundary to the surface of the passivation layer during the bonding process. Therefore, the bonding structure can be formed with sufficient bonding strength and conductivity even under a low temperature.

In accordance with the instant disclosure, when the passivation layer is subjected to a depth profile analysis by X-ray photoelectron spectroscopy (XPS), along the "etch time" axis in the XPS analysis spectrum, the range of the depth from zero point to the first turning point of the analyzed element is defined as the "surface" of the passivation layer.

In accordance with the instant disclosure, the polycrystalline structure of the passivation layer refers to the state of the crystal structure of the passivation layer after forming but without a high temperature treatment or a high pressure treatment.

In accordance with the instant disclosure, the passivation layer may be in a form of a continuous film or a discontinuous film such as an island-like film.

Preferably, the passivation layer may have an average thickness of larger than or equal to 1 nm and smaller than or equal to 60 nm, but it is not limited thereto. More preferably, the passivation layer may have an average thickness of larger than or equal to 3 nm and smaller than or equal to 15 nm.

In some embodiments, the passivation layer may be formed on the bonding substrate by a sputtering target through a sputtering process; wherein the material of the sputtering target comprises the first metal, the second metal or a combination thereof, and an O content in the sputtering target is less than 10 parts per million (10 ppm). Preferably, the O content in the sputtering target is less than or equal to 5 ppm, but it is not limited thereto. The aforementioned O content is the weight ratio of the weight of 0 contained in the sputtering target relative to the total weight of the sputtering target.

Preferably, the sputtering method to form the passivation layer by the sputtering target may be a DC magnetron sputtering or a radio-frequency magnetron sputtering.

In some embodiments, the metal component of the sputtering target may comprise the first metal rather than the second metal, so the formed passivation layer comprises the first metal. For example, the metal component of the sputtering target may essentially comprise only Au metal (i.e. its metal purity greater than or equal to 3N, 99.9%, such as 4N, 5N, 6N, etc.); the metal component of the sputtering target may essentially comprise only Ag metal (i.e. its metal purity greater than or equal to 3N, 99.9%, such as 4N, 5N, 6N, etc.); the metal component of the sputtering target may essentially comprise only Pt metal (i.e. its metal purity greater than or equal to 3N, 99.9%, such as 4N, 5N, 6N, etc.); or the metal component of the sputtering target may essentially comprise only Ru metal (i.e. its metal purity greater than or equal to 3N. 99.9%, such as 4N, 5N. 6N, etc.), but it is not limited thereto.

In some embodiments, relative to the total weight of the sputtering target, the content of the first metal in the sputtering target is greater than 99 weight percent (wt %); or the content of the first metal in the sputtering target is greater than or equal to 99.5 wt %, 99.9 wt % or 99.99 wt %, but it is not limited thereto.

In other embodiments, the metal component of the sputtering target may comprise the second metal rather than the first metal, so the formed passivation layer comprises the second metal. For example, the metal component of the sputtering target may essentially comprise only Cu metal (i.e. its metal purity greater than or equal to 3N, 99.9%, such as 4N, 5N, 6N, etc.); or the metal component of the sputtering target may essentially comprise only Pd metal (i.e. its metal purity greater than or equal to 3N, 99.9%, such as 4N, 5N, 6N, etc.). Preferably, when the sputtering target comprises the second metal rather than the first metal, the second metal is Pd metal.

In some embodiments, relative to the total weight of the sputtering target, the content of the second metal in the sputtering target is greater than 99 wt %; or the content of the second metal in the sputtering target is greater than or equal to 99.5 wt %, 99.9 wt % or 99.99 wt %, but it is not limited thereto.

In other embodiments, the metal component of the sputtering target may be the first metal, the second metal or a combination thereof.

Since the second metal and the first metal are different and they are immiscible, when the second metal is doped into the first metal, it is conducive to grain refinement. Accordingly, preferably, the metal component of the sputtering target may comprise the first metal and the second metal at the same time. Therefore, the formed passivation layer comprises the first metal and the second metal at the same time. For example, the metal component of the sputtering target may comprise Ag and Cu at the same time; or the metal component of the sputtering target may comprise Ag, Cu and Pd at the same time, but it is not limited thereto.

Preferably, when the sputtering target comprises the first metal and the second metal, based on the total weight of the sputtering target, the content of the second metal may be not larger than 10 wt %, but it is not limited thereto. In some embodiments, the content of the first metal may be larger than or equal to 90 wt % and less than 99 wt %, and the content of the second metal may be larger than or equal to 1 wt % and less than 10 wt %. In other embodiments, the content of the first metal may be larger than or equal to 90 wt % and less than 97 wt %, and the content of the second metal may be larger than or equal to 3 wt % and less than 10 wt %.

Preferably, when the sputtering target comprises the first metal and the second metal, the second metal in the sputtering target may have a maximum concentration deviation smaller than 0.2 at %. In this specification, samples are individually taken from the four sides of the green body of the sputtering target (i.e. at the point from the center point of the sputtering target to the upper, lower, left, and right respectively in the distance of 75 millimeters (mm) to 100 mm) for an elemental composition analysis, and the difference between the highest value and the lowest value among the four obtained results is defined as the "concentration deviation", wherein the unit is at %. In the case that the sputtering target contains more than N elements (N is an integer equal to or greater than 3), N−1 sets data of the concentration deviation for the elements will be obtained; the largest value among the N−1 sets data represents the uniformity of the sputtering target, which is called the "maximum concentration deviation".

In some embodiments, when the sputtering target comprises more than one kind of metal, for example, two kinds of the first metal at the same time, two kinds of the second metal, or at least one kind of the first metal and at least one kind of the second metal, it is conducive to control the deposition rate of sputtering process, thereby easily controlling the uniformity of the thickness of the sputtered film, so that the formed passivation layer can have a better continuity at a thinner thickness and have a lower surface roughness.

In other embodiments, the metal components of the sputtering target may consist of the first metal and the second metal.

In addition, the roughness of the bonding face also affects whether the bonding process will generate gaps at the bonding interface to cause a poor bonding quality. Preferably, the surface of the passivation layer may have an arithmetic average roughness (Ra) of less than 3 nm; more preferably, the surface of the passivation layer has the Ra less than 2 nm. Preferably, the surface of the passivation layer may have a root mean square roughness (Rq) of less than 3 nm; more preferably, the surface of the passivation layer has the Rq less than 2.5 nm.

In the situation that the passivation layer does not undergo an anneal process, for example, at the time that the passivation layer is just formed, preferably, based on the total atom number of the surface of the passivation layer, the O content of the surface of the passivation layer is less than or equal to 20 at %; more preferably, the O content of the surface of the passivation layer is less than or equal to 15 at % such as 12 at %, 10 at % and 8 at %, but it is not limited thereto.

In the situation that the passivation layer does not undergo an anneal process, for example, at the time that the passivation layer is just formed, preferably, based on the total atom number of the surface of the passivation layer, a content of the third metal of the surface of the passivation layer is less than or equal to 8 at %; more preferably, the content of the third metal of the surface of the passivation layer is less than or equal to 5 at % such as 4 at %. 3 at % and 2 at %, but it is not limited thereto.

In some embodiments, after the passivation layer undergoes an anneal process, the content of the third metal of the surface of the passivation layer is larger than 20 at %; wherein a temperature of the anneal process is larger than or equal to 70° C. and smaller than 200° C., and a duration of the anneal process is larger than 30 minutes (min) and smaller than or equal to 60 min.

Preferably, after the passivation layer undergoes the anneal process, the content of the third metal of the surface of the passivation layer may be larger than or equal to 30 at %. More preferably, after the passivation layer undergoes the anneal process, the content of the third metal of the surface of the passivation layer may be larger than or equal to 40 at % such as 45 at %, 50 at %, 55 at % and 60 at %; wherein the temperature of the anneal process is larger than or equal to 70° C. and smaller than or equal to 150° C."

The instant disclosure also provides a semiconductor bonding structure, comprising a first bonding substrate, a second bonding substrate and a bonding layer; the bonding layer is located between the first bonding substrate and the second bonding substrate. A material of the first bonding substrate and a material of the second bonding substrate independently comprise a third metal which is Au, Al, Cu, Co, Ru or any combination thereof. The bonding layer is formed by the passivation layer as mentioned previously and a diffusion of the third metal of the first bonding substrate and the third metal of the second bonding base material: the bonding layer comprises the third metal and the material of the passivation layer. The bonding layer comprises a first zone and a second zone; based on a total atom number of the first zone, a content of the third metal in the first zone is less than 50 at %; based on a total atom number of the second zone, a content of the third metal in the second zone is larger than or equal to 50 at %.

By simultaneously defining the formation method of the bonding layer of the semiconductor bonding structure and the specific composition and their contents in the first zone and the second zone of the bonding layer, it can ensure that there is no amorphous oxide formed in the passivation layer during the bonding process. Therefore, the semiconductor bonding structure can be formed in a low temperature environment. In addition, with forming the first zone of the bonding layer (containing a larger proportion of the material of the passivation layer) and the second zone (containing a larger proportion of the third metal), the semiconductor bonding structure can have a high bonding strength and a high conductivity.

In some embodiments, the bonding layer may be formed by joining the first passivation layer on the first bonding substrate and the second passivation layer on the second bonding substrate and the diffusion of the third metal of the first bonding substrate and the third metal of the second bonding substrate. In other embodiments, the bonding layer may be formed by a single passivation layer on the first or a single passivation layer on the second bonding substrate and the diffusion of the third metal of the first bonding substrate and the third metal of the second bonding substrate.

Specifically, an arrangement of the first zone and the second zone may be that the first and second zones are arranged side by side in sequence or that the second zone surrounds the first zone, but it is not limited thereto. For example, if the first and second zones are arranged side by side in sequence, observing from the direction parallel to the first bonding face and the second bonding face, the first zones and the second zones are alternately arranged. In the case that the passivation layer is in the form of an island-like film, the resulting bonding layer roughly exhibits an arrangement in which the second zones surround the first zones. In the case that the passivation layer is in the form of a continuous film, the resulting bonding layer roughly exhibits an arrangement in which the first and second zones are arranged side by side in sequence.

In some embodiments, a volume of the first zone may be larger than a volume of the second zone.

Preferably, both of the material of the first bonding substrate and the material of the second bonding substrate comprise Cu metal, but it is not limited thereto.

Preferably, the material of the passivation layer and the material of the bonding substrate are not exactly the same. For example, when both of the material of the first bonding substrate and the material of the second bonding substrate are Cu metal, the material of the passivation layer forming the bonding layer comprises not only Cu metal or it is not Cu metal. For example, the material of the passivation layer comprises Au, and the materials of the first and second bonding substrates both are Cu. Alternatively, the material of the passivation layer comprises Ag and Cu, and the materials of the first and second bonding substrates both are Cu, but it is not limited thereto.

In some embodiments, the semiconductor bonding structure further comprises a first reaction layer and a second reaction layer, the first reaction layer is between the bonding layer and the first bonding substrate, and the second reaction layer is between the bonding layer and the second bonding substrate. The first reaction layer and the second reaction layer respectively comprise a first sublayer and a second sublayer; the first sublayer of the first reaction layer is joined to the first bonding substrate, and the second sublayer of the first reaction layer is joined to the bonding layer; the first sublayer of the second reaction layer is joined to the second bonding substrate, and the second sublayer of the second reaction layer is joined to the bonding layer. Based on a total atom number of each of the first sublayers, a content of the third metal in each of the first sublayer is larger than 50 at %; based on a total atom number of each of the second sublayers, a content of the material of the passivation layer in each of the second sublayers is larger than 50 at %. That is, the first reaction layer and the second reaction layer are concentration gradients of the third metal atoms formed by the diffusion of the third metal from the first bonding substrate and the second bonding substrate into the passivation layer.

The instant disclosure also provides a semiconductor bonding process, comprising step (A) to step (D). Step (A): a first bonding substrate and a second bonding substrate are prepared; wherein a material of the first bonding substrate and a material of the second bonding substrate independently comprise a third metal which is Au. Al, Cu, Co. Ru or any combination thereof. Step (B): a first passivation layer is formed on an end face of the first bonding substrate, and a second passivation layer is formed on an end face of the second bonding substrate; wherein each of the first passivation layer and the second passivation layer is respectively the passivation layer as mentioned previously, and the outer surface of the first passivation layer refers to a first bonding face and the outer surface of the second passivation layer refers to a second bonding face. Step (C): the first passivation layer and the second passivation layer are put together in a face-to-face manner to form a laminated structure in a bonding environment. Step (D): a bonding force to the laminated structure is applied in the bonding environment so that the first bonding face and the second bonding face are joined together and the aforesaid semiconductor bonding structure is obtained. A bonding temperature of the bonding environment is larger than or equal to 70° C. and smaller than 200° C., and a duration of applying the bonding temperature is smaller than or equal to 60 min.

The semiconductor bonding process of the instant disclosure first forms the aforesaid passivation layer on the first and second bonding substrates, and then forms the aforesaid semiconductor bonding structure in a bonding environment at an appropriate temperature, and therefore the semiconductor bonding process can be finished at a lower temperature, and the resulting semiconductor bonding structure can have a high bonding strength and a high conductivity.

In some embodiments, in Step (B), the first passivation layer and the second passivation layer may be respectively formed on the end face of the first bonding substrate and on the end face of the second bonding substrate by the aforesaid sputtering target.

In some embodiments, in Step (D), the bonding temperature may be larger than or equal to 100° C. and smaller than 200° C., but it is not limited thereto. Specifically, the temperature may be 110° C., 150° C., 160° C. 170° C. or 180° C.

In some embodiments, in Step (D), the bonding force may be larger than 5,000 N and less than or equal to 15,000 N, but it is not limited thereto. In other embodiments, in Step (D), the bonding force may be larger than or equal to 50 N and less than or equal to 1,000 N, but it is not limited thereto. That is, the bonding force can be adjusted dependent on the size of the bonding area.

In some embodiments, in Step (D), the duration of applying the bonding temperature may be larger than or equal to 0.5 minute and smaller than or equal to 60 minutes such as 1 minute. 5 minutes. 10 minutes and 50 minutes.

The instant disclosure also provides a sputtering target used to make a passivation layer for forming the bonding layer, and the sputtering target comprises a first metal, a second metal or a combination thereof, and an O content in the sputtering target is less than 10 ppm; wherein the first metal is Au, Ag, Pt, Ru, Al or any combination thereof; the second metal is Cu, Pd or a combination thereof.

By controlling the material compositions and the O content in the sputtering target of the instant disclosure, the generating of amorphous oxide in the passivation layer formed by the sputtering target can be prevent; also, it can ensure the metal atoms of the bonding substrate will not diffuse excessively to the surface of the passivation layer before a bonding process, but the metal atoms of the bonding substrate can diffuse sufficiently during a bonding process.

The composition and manufacturing method of the "sputtering target used to make a passivation layer for forming the semiconductor bonding structure" can refer to the "sputtering target" disclosed in the above-mentioned description "the passivation layer may be formed on the bonding substrate by a sputtering target through a sputtering process".

In some embodiments, when the sputtering target comprises the first metal and the second metal, based on a total weight of the sputtering target, a content of the second metal is not larger than 10 wt %, and the second metal in the sputtering target has a maximum concentration deviation smaller than 0.2 at %. Preferably, the content of the second metal is not larger than 5 wt %, and the second metal in the sputtering target has the maximum concentration deviation smaller than 0.2 at %. Preferably, the second metal in the sputtering target may have the maximum concentration deviation smaller than 0.15 at %, but it is not limited thereto.

Accordingly, the aforesaid sputtering target can make the resulting passivation layer have a better surface roughness and a better film continuity.

BRIEF DESCRIPTION OF THE DRAWINGS

FIG. 61 is a SAT image of the section of the semiconductor bonding structure of Reference Example 1A obtained from a bonding process at 200° C.;

DETAILED DESCRIPTION OF THE PREFERRED EMBODIMENTS

Figure 1A:
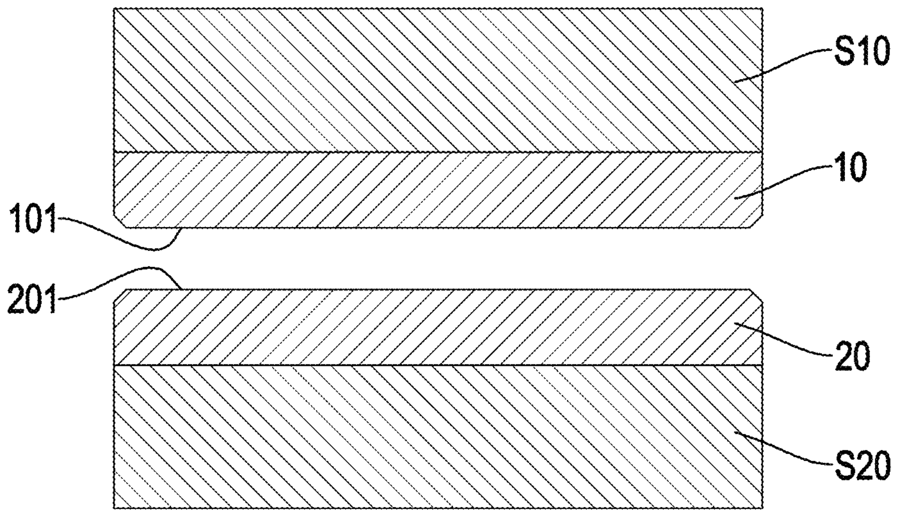
FIG. 1A is a schematic view of a passivation layer for forming a semiconductor bonding structure of the instant disclosure.

Hereinafter, several examples are exemplified to illustrate the implementation of the sputtering target, the passivation layer, the semiconductor bonding structure and semiconductor bonding process of the instant disclosure. Several comparative examples are also provided for comparison. One person skilled in the art can easily realize the advantages and effects of the instant disclosure in accordance with the following examples and comparative examples. It should be understood that the embodiments listed in this specification are illustrative only to the implementation of the instant disclosure and are not intended to limit the scope of the instant disclosure. Various modifications and variations could be made based on the common knowledge of one person skilled in the art in order to practice or apply the instant disclosure without departing from the spirit and scope of the invention.

Preparation Example 1: Sputtering Target (T1)

First, an appropriate amount of Ag metal granules (purity of 3N5 or above) was weighted and put in a crucible, and then the crucible was placed in a high vacuum smelting furnace to prepare a molten liquid; wherein the temperature was set at 1000° C. and the vacuity was 100 mtorr to 200 mtorr. During the smelting process, a refractory tube was immersed in the molten liquid to introduce argon (Ar) gas. During floating of the Ar gas from the bottom of the molten liquid, the oxygen ions in the molten liquid were taken out and removed because of the high vacuum. At the same time, the Ar gas bubbles also stirred the molten liquid evenly during the process. Therefore, the oxygen content in the molten liquid was reduced, and the composition uniformity of the obtained casting ingot also improved. After the raw materials in the crucible were completely molted and the temperature had been kept for 15 min, then the molten liquid was subjected to a casting process to obtain the casting ingot. Next, the casting ingot was subjected to a hot rolling and a processing to obtain Sputtering Target T1.

Preparation Example 2: Sputtering Target (T2)

Preparation Example 2 was similar to Preparation Example 1. The main difference between them was: the raw material of Preparation Example 2 was Au metal granules (purity of 3N5 or above) and the temperature of the high vacuum smelting furnace was set at 1100° C. Finally, Sputtering Target T2 was obtained.

Preparation Example 3: Sputtering Target (T3)

Preparation Example 3 was similar to Preparation Example 1. The main difference between them was: the raw material of Preparation Example 3 was Pt metal granules (purity of 3N5 or above) and the temperature of the high vacuum smelting furnace was set at 1900° C. Finally, Sputtering Target T3 was obtained.

Preparation Example 4: Sputtering Target (T4)

Preparation Example 4 was similar to Preparation Example 1. The main difference between them was: the raw material of Preparation Example 4 was Pd metal granules (purity of 3N5 or above) and the temperature of the high vacuum smelting furnace was set at 1650° C. Finally, Sputtering Target T4 was obtained.

Preparation Example 5: Sputtering Target (T5)

Preparation Example 5 was similar to Preparation Example 1. The main difference between them was: the raw material of Preparation Example 5 was Ag metal granules (purity of 3N5 or above), Pd metal granules (purity of 3N5 or above) and Cu metal granules (purity of 3N5 or above).

Specifically, first, an appropriate amount of Ag, Pd and Cu metal granules was weighted and put in a crucible, and then the crucible was placed in a high vacuum smelting furnace to prepare a molten liquid; wherein the temperature was set at 1100° C. and the vacuity was 100 mtorr to 200 mtorr. Based on the total weight of the raw materials, the Ag metal granules occupied 98 wt %, the Pd metal granules occupied 1 wt/o, and Cu metal granules occupied 1 wt %. During the smelting process, a refractory tube was immersed in the molten liquid to introduce Ar gas. After the raw materials in the crucible were completely molted and the temperature had been kept for 15 min, then the molten liquid was subjected to a casting process to obtain the casting ingot. Next, the casting ingot was subjected to a hot rolling and a processing to obtain Sputtering Target T5 whose weight ratio composition was 98Ag—1Pd—1Cu.

Preparation Example 6: Sputtering Target (T6)

Preparation Example 6 was similar to Preparation Example 1. The main difference between them was: there was no Ar gas introduced during the smelting process and the temperature of the high vacuum smelting furnace was set at 1000° C. Specifically, first, an appropriate amount of Ag metal granules (purity of 3N5 or above) was weighted and put in a crucible, and then the crucible was placed in a high vacuum smelting furnace to prepare a molten liquid; wherein the temperature was set at 1000° C. and the vacuity was 100 mtorr to 200 mtorr. Afterwards, the raw materials in the crucible were completely molted and the molten liquid was directly subjected to a casting process to obtain the casting ingot. Next, the casting ingot was subjected to a hot rolling and a processing to obtain Sputtering Target T6.

Preparation Example 7: Sputtering Target (T7)

Preparation Example 7 was similar to Preparation Example 1. The main difference between them was: the raw material of Preparation Example 7 was Ni metal granules (purity of 3N5 or above) and the temperature of the high vacuum smelting furnace was set at 1550° C. Finally, Sputtering Target T7 was obtained.

Preparation Example 8: Sputtering Target (T8)

Preparation Example 8 was similar to Preparation Example 6. The main difference between them was: the raw material of Preparation Example 8 was Ti metal granules (purity of 3N5 or above) and the temperature of the high vacuum smelting furnace was set at 1750° C. Finally, Sputtering Target T8 was obtained.

Preparation Example 9: Sputtering Target (T9)

Preparation Example 9 was similar to Preparation Example 5. The main difference between them was: the raw material of Preparation Example 9 was Ag metal granules (purity of 3N5 or above) and Zn metal granules (purity of 3N5 or above); there was no Ar gas introduced during the smelting process.

Specifically, first, an appropriate amount of Ag and Zn metal granules was weighted and put in a crucible, and then the crucible was placed in a high vacuum smelting furnace to prepare a molten liquid: wherein the temperature was set at 1100° C. and the vacuity was 100 mtorr to 200 mtorr.

Based on the total weight of the raw materials, the Ag metal granules occupied 99.5 w % and Zn metal granules occupied 0.5 wt %. After the raw materials in the crucible were completely molted and the temperature had been kept for 15 min, then the molten liquid was subjected to a casting process to obtain the casting ingot. Next, the casting ingot was subjected to a hot rolling and a processing to obtain Sputtering Target T9 whose weight ratio composition was 99.5Ag—0.5Zn.

Analysis 1: Oxygen Content in the Sputtering Target 0.2 grams (g) to 0.8 g of the sputtering targets (T1 to T9) of Preparation Examples 1 to 9 were respectively taken as test samples. Next, each group of the test samples individually was placed in a graphite crucible to be burned under an atmosphere of continuous helium (He) gas so that the O content in the test samples would convert to carbon monoxide (CO). Finally, an oxygen nitrogen analyzer (model: EMGA-620W manufactured by HORIBA Company) based on non-dispersive infrared absorption method was used to detect and obtain the O content in each group of the test samples, and the results were listed in Table 1.

Analysis 2: Concentration Deviation of the Sputtering Target

Take a square green body from the respective sputtering targets of Preparation Examples 5 and 9 obtained after the hot rolling process (the length and the width were respectively about 150 mm to 200 mm). In each square green body, samples were individually taken from the four sides of the green body at the point which had a distance from the sputtering target center of 75 mm to 100 mm, and an ICP-OES spectrometer (model: Optima 5300 DV manufactured by PerkinElmer company) was used to analyze for an elemental composition analysis. The difference between the highest and the lowest values of the same measured element was defined as "concentration deviation" (unit: at %), and the measured results were listed in Table 1. The smaller the concentration deviation, the better the element uniformity in the sputtering target.

In Sputtering Target T5 of Preparation Example 5, Cu and Pd were doped in Ag at the same time. For the Cu element, the concentration deviation was 0.08 at %, while for the Pd element, the concentration deviation was 0.11 at %. Accordingly, 0.11 at % was used as a representative of the concentration deviation of Sputtering target T5 (i.e. the maximum concentration deviation).

In addition, in Sputtering Target T9 of Preparation Example 9, Zn was doped in Ag. For the Zn element, the concentration deviation was 1.27 at %: accordingly, the maximum concentration deviation of Sputtering Target T9 was defined to 1.27 at %.

Preparation of Bonding Substrates

A4-inch silicon wafer was taken and placed in the furnace tube, and a silicon dioxide film with a thickness of 500 nm was formed as an insulating layer. Next, a Ti metal film with a thickness of 30 nm was deposited on the silicon dioxide film as an adhesion layer by a sputtering process; then a Cu metal film with a thickness of 300 nm was then deposited on the Ti metal film as the bonding substrate by a sputtering process. The passivation layers of the following examples and comparative examples were all formed on the same bonding substrate.

As shown in FIG. 1A, a first passivation layer 10 was formed on a first bonding substrate S10, and the outer surface of the first passivation layer 10 was defined as the first bonding face 101. A second passivation layer 20 was formed on a second bonding substrate S20, and the outer surface of the second passivation layer 20 was defined as the second bonding face 201. The first passivation layer 10 and the second passivation layer 20 did not undergo an anneal process.

Examples 1 to 6: Passivation Layer (E1 to E6)

Example 1

The sputtering target T1 of Preparation Example 1 was placed in a vacuum magnetron sputtering machine with continuously introducing Ar gas, and was subjected to the same sputtering process to at least three bonding substrates (i.e. the first bonding substrate, the second bonding substrate, and a bonding substrate for the test of the anneal process), thereby forming the first passivation layer, the second passivation layer and the passivation layer for the test of the anneal process; wherein the passivation layer for the test of the anneal process was used for subsequent Analysis 3 to Analysis 6, and the first passivation layer and the second passivation layer were used for subsequent Analysis 7 to Analysis 11. That is, the passivation layer for the test of the anneal process represented the passivation layer E1 of Example 1, and the obtained layer from a bonding process with the first passivation layer and the second passivation layer represented the passivation layer E1 A of Example 1 A.

The sputtering process parameters were listed as follows:

1. Ar gas flow: 20 sccm (Standard Cubic Centimeter per Minute) to 50 sccm;
2. Working pressure vacuum degree: $1\times10^{2}$ torr to $1\times10^{-4}$ torr;
3. Power density: 0.1 Watt/cm$^2$ (W/cm$^2$) to 0.6 W/cm$^2$,
4. Sputtering duration: 5 seconds (sec) to 35 sec.

Wherein the sputtering duration was adjusted according to the measured deposition rate for different materials of the passivation layers so that the passivation layers on the

TABLE 1

Component, O content, maximum concentration deviation of the sputtering targets of Preparation Examples 1 to 9

| No. | T1 | T2 | T3 | T4 | T5 | T6 | T7 | T8 | T9 |
|---|---|---|---|---|---|---|---|---|---|
| component | Ag | Au | Pt | Pd | 98Ag—1Pd—1Cu | Ag | Ni | Ti | 99.5Ag—0.5Zn |
| O content (ppm) | 3.56 | 2.41 | 3.23 | 2.55 | 4.83 | 31.44 | 4.88 | 28.13 | 23.14 |
| maximum concentration deviation (at %) | — | — | — | — | 0.11 | — | — | — | 1.27 |

bonding substrates can be formed in an average thickness ranging from 1 nm to 60 nm.

Example 2

Referring to the making method of the passivation layers in Example 1, the sputtering target T1 of Preparation Example 1 was placed in a vacuum magnetron sputtering machine with continuously introducing Ar gas, and was subjected to the same sputtering process to at least three bonding substrates (i.e. the first bonding substrate, the second bonding substrate, and a bonding substrate for the test of the anneal process). The main difference between Example 2 and Example 1 was that the sputtering duration was extended so that the resulting passivation layers were thicker. Therefore, the passivation layer E2 in Example 2 was in the form of continuous film while the passivation layer E1 exhibited an island-like film since the thickness of the passivation layer E1 in Example 1 was thinner.

Examples 3 to 6: Passivation Layers

The passivation layers of Examples 3 to 6 were produced by the making methods similar to that of the passivation layer of Example 2. The main difference between them was: the passivation layers of Examples 3 to 6 were formed by the sputtering targets T2 to T5 of Preparation Examples 2 to 5 respectively. Finally, the passivation layer E3 of Example 3 to the passivation layer E6 of Example 6 were respectively obtained.

Comparative Examples 1 to 4: Passivation Layers

The passivation layers of Comparative Examples 1 to 4 were produced by the making methods similar to that of the passivation layer of Example 2. The main difference between them was: the passivation layers of Comparative Examples 1 to 4 were formed by the sputtering targets T6 to T9 of Preparation Examples 6 to 9 respectively. Finally, the passivation layer C1 of Comparative Example 1 to the passivation layer C4 of Comparative Example 4 were respectively obtained.

Anneal Process

In order to further understand the diffusion of the third metal (such as Cu metal) in the bonding substrates after the bonding process, the anneal process was adopted to simulate the bonding process. The 4-inch wafers respectively had the passivation layers for the test of the anneal process in Examples 1 to 6 and Comparative Examples 1 to 4 thereon, and those 4-inch wafers were placed in a high-temperature thermal cycling oven (model: DH-400N, manufacturer: YOTEC) for the anneal process; wherein the anneal process was performed under a nitrogen environment and the temperature and duration thereof were set at the same as the bonding process, and the annealing temperatures used in each Example and Comparative Example were recorded in Table 2. When the preset annealing duration was completed, the high-temperature thermal cycling oven would turn off the heating system, and each sample was stood to cool to room temperature, and then the nitrogen environment was turned off to take out each sample.

Analysis 3: Continuity Analyses of Passivation Layer

Image observations for the sections of the passivation layers E1 to E6 of Examples 1 to 6 and the passivation layers C1 to C4 of Comparative Examples 1 to 4 before the anneal process were analyzed by a transmission electron microscope (TEM: model: JEM-2010F, manufacturer: JEOL). Under an acceleration voltage below or equal to 200 kilovolts (kV), the uniformity and continuity at different positions of each passivation layer were observed, and the types of each passivation layers were recorded in Table 2.

Analysis 4: Surface Roughness Analyses of Passivation Layer

Surface topography and roughness of each of the passivation layers before the anneal process were analyzed by the tapping mode of an atomic force microscope (AFM: model: Bruker Dimension® Icon™, manufacturer: Bruker). Ra and Rq of each passivation layer were obtained and recorded in Table 2. The AFM could support a maximum planar scanning range of 90 μm×90 μm and a vertical scanning range of 10 μm height to measure two-dimensional and three-dimensional topography.

Analysis 5: Average Thickness Analysis of Passivation Layer

Average thickness for the sections of the passivation layers E1 to E6 of Examples 1 to 6 and the passivation layers C1 to C4 of Comparative Examples to 4 before the anneal process were analyzed by the TEM. The built-in image analysis software of the TEM was used to analyze the thickness of five random positions on the TEM image of each of the passivation layers, and then the average thickness of each of the passivation layers was calculated, and the results were recorded in Table 2.

Analysis 6: Elemental Content Analyses

Content of elements in depth profile analysis for the passivation layers E1 to E6 of Examples t to 6 and the passivation layers C1 to C4 of Comparative Examples 1 to 4 before and after the anneal process were all analyzed by XPS (model: Thermo Fisher Scientific Theta Probe, manufacturer: Thermo Fisher).

The O content of the surface of the passivation layers of each Example and Comparative Example (i.e. the etch time at 0 in the XPS spectra) was detected to represent the information on the surface oxidation level of the passivation layers.

In addition, through the characteristic X-ray produced by Al, the proportion of the content of Cu on the surface of the passivation layers (i.e. the etch time at 0 in the XPS spectra) of each Example and Comparative Example was obtained by comparisons, which was defined as the Cu diffusion amount before annealing. The contents of O and Cu on the surface of the passivation layers of each Example and Comparative Example before annealing were listed in Table 2.

After the aforesaid the anneal process was performed in each sample, the elemental content analyses were performed again for each sample that had undergone the anneal process. It must be illustrated that although the anneal process simulated the bonding process so that the environmental conditions for annealing were set the same as that of the bonding process, the bonding face of the passivation layer was exposed to the anneal environment while in the actual bonding process, the two bonding faces of the two passivation layers joined each other, thereby not being exposed to the bonding environment. Therefore, when reading the XPS spectra for each sample that had undergone the anneal process, the first obvious turning point after the etch time at 0 (as shown like the arrows in FIGS. 2B, 3B, 4B, and 5B) would be picked to represent the content of Cu diffusing to the surface of the passivation layers after annealing in order to eliminate the influence caused by the exposure of the bonding face (such as oxygen or carbon contamination), and then was recorded in Table 2.

Besides, the passivation layers E1, E3, C2 and C3 before annealing were respectively analyzed by the XPS to obtain the elemental analyses in the spectrum as shown in FIGS. 2A, 3A, 4A and 5A. In addition, the passivation layers E1, E3, C2 and C3 after annealing were respectively analyzed by the XPS to obtain the elemental analyses in the spectrum as shown in FIGS. 2B, 3B, 4B and 5B.

Table 2: No. of the passivation layers of Examples 1 to 6 and Comparative Examples 1 to 4. No. of the adopted sputtering targets and its component(s), the type of the passivation layers, the surface roughness, the average thickness, the contents of O and Cu of the surface of the passivation layers before annealing, temperature and duration of the anneal process and the Cu content of the surface of the passivation layers after annealing

| No. of the passivation layer | E1 | E2 | E3 | E4 | E5 |
|---|---|---|---|---|---|
| No. of the sputtering target/its component | Sputtering Target T1/Ag | | Sputtering Target T2/Au | Sputtering Target T3/Pt | Sputtering Target T4/Pd |
| type of the passivation layer | Island-like | Continuous | Continuous | Continuous | Continuous |
| Ra (nm) | 1.82 | 1.19 | 1.68 | 1.64 | 1.35 |
| Rq (nm) | 2.29 | 1.49 | 2.08 | 2.07 | 1.76 |
| average thickness (nm) | 5.2 | 11.4 | 11.0 | 11.8 | 7.6 |
| O content before annealing (at %) | 18 | 29 | 3 | 7 | 5 |
| Cu content before annealing (at %) | 5 | 8 | 2 | 10 | 10 |
| Temp./duration of the anneal process | 150° C./50 min | 150° C./50 min | 120° C./50 min | 180° C./50 min | 150° C./50 min |
| Cu content after annealing (at %) | 60 | 55 | 43 | 30 | 22 |

| No. of the passivation laver | E6 | C1 | C2 | C3 | C4 |
|---|---|---|---|---|---|
| No. of the sputtering target/its component | Sputtering Target T5/ 98Ag—1Pd—1Cu | Sputtering Target T6/Ag | Sputtering Target T7/Ni | Sputtering Target T8/Ti | Sputtering Target T9/ 99.5Ag—0.5Zn |
| type of the passivation layer | Continuous | Continuous | Continuous | Continuous | Continuous |
| Ra (nm) | 1.24 | 4.56 | 1.37 | 3.56 | 1.24 |
| Rq (nm) | 1.55 | 5.02 | 1.94 | 4.56 | 1.56 |
| average thickness (nm) | 8.8 | 10.2 | 10.3 | 10.0 | 11.6 |
| O content before annealing (at %) | 20 | 57 | 17 | 45 | 42 |
| Cu content before annealing (at %) | 5 | 18 | 0 | 5 | 10 |
| Temp./duration of the anneal process | 150° C./50 min | 150° C./50 min | 200° C./50 min | 200° C./50 min | 200° C./50 min |
| Cu content after annealing (at %) | 40 | 28 | 2 | 10 | 39 |

2 Semiconductor Bonding Structures and Semiconductor Bonding Processes

Wafer-level bonding mainly used a wafer-level bonder (model: AWB-08, manufacturer: AML) for the bonding process.

First, the 4-inch wafers coated with the first passivation layers and the second passivation layers in Examples 1 to 6 and Comparative Examples 1 to 4 were taken; next, two identical silicon wafers in each group were put in the wafer-level bonder in a manner in which their respective passivation layers were face to face. The upper cover of the bonder was closed and the evacuation was started until the vacuum level inside the body of the bonder reached $10^{-5}$ torr, and then the bonding process was carried out.

The bonding process included a heating part and a pressurizing part. The heat source of the wafer-level bonder was heated from the heat source of the upper cover and the heat source of the lower carrier platform respectively. After the temperature of the samples and the upper and lower carrier platforms reached the set bonding temperature in the vacuum environment, in each group of the samples, the part on the lower carrier platform contacted the other part on the upper carrier platform by lifting the lower carrier platform so that the two passivation layers in each group of the samples were put together to form a laminated structure, and then a bonding force (5,000 N to 15,000 N) was continuously applied thereto.

After the predetermined process duration ended, the lower carrier platform was lowered to release the pressurizing part, and the heat source was turned off to let the samples cool down. After the sample temperature lowered to 50° C. or below, the operation of the vacuum system was closed, and then the nitrogen gas was introduced to bring the body of the bonder back to the atmospheric environment. After the body environment returned to the atmospheric environment and room temperature, the completed semiconductor bonding structure could be taken out.

For the chip-level bonding test, it mainly used the test key with a Kelvin structure to obtain the specific contact resistance of the semiconductor bonding structure, thereby evaluating the conductivity of the semiconductor bonding structure. Two 4-inch wafers on which the passivation layers were deposited were subsequently processed by photolithography and etching processes to form the corresponding test key with a Kelvin structure. Next, the two 4-inch silicon wafers were proceeded to wafer-dicing, and then a flip-chip bonder (model: ACCμRA100, manufacturer: SET) was used to perform a chip-level bonding process between the obtained upper chip and the lower chip.

The wafer dicing process mainly adopted a dicing machine (model: 2H/6T, manufacturer: Disco) for dicing. After a completion of forming the passivation layer on the 4-inch wafer, the samples for chip-level bonding were respectively prepared by a waterjet according to different size requirements. Before performing the chip-level bonding process, the upper chip and the lower chip would be placed on the chip tray, so as to become fixed in position and facilitate the robot arm of the machine to execute pick-and-place operations more accurately. During the bonding process, the lower chip was first adsorbed by the vacuum through holes of the robot arm to be taken out from the chip tray and then be placed onto the platform of the machine; and then the vacuum through holes on the platform were used for fixing it by vacuum adsorbing. After a completion of the fixing of the lower chip, the robot arm took out the upper chip from the chip tray and moved it over the lower chip. The machine's two-way lens was used to align the metal patterns of test keys with the Kelvin structure of the upper and lower chips to finish the alignment and position adjustment thereof. Then, a bonding operation followed; wherein the overlapping area of the test keys with the Kelvin structure on the upper and lower chips is a square area of 70 microns (μm)×70 μm. The bonding operation mainly moved the robot arm that absorbed the upper chip to make the passivation layer of the upper chip (i.e. the first passivation layer) and the passivation layer of the lower chip (i.e. the second passivation layer) come into face-to-face contact with each other, thereby forming a laminated structure, and then a bonding force (50 N to 1,000 N) was applied to the laminated structure; at the same time, the robot arm and the lower platform provided heat from heat source.

After the predetermined duration ended, the robot arm would release the vacuum of the vacuum through holes and lift up and move to the original position. The robot arm and the lower platform would also turn off the heat source and wait for the temperature of the bonding components dropping to the room temperature to finish the bonding process.

The 4-inch wafers including passivation layers in Examples and Comparative Examples were each respectively subjected to a wafer-level bonding process and a chip-level bonding process to obtain the semiconductor bonding structures E1A to E6A of Examples 1A to 6A and the semiconductor bonding structures C1A to C4A of Comparative Examples 1A to 4A. Wherein, the semiconductor bonding structures undergoing the wafer-level bonding process were subsequently subjected to analyses in types of bonding layers, crystallization states of bonding layers, elemental contents of the bonding layers and reaction layers, and bonding strength. The semiconductor bonding structures undergoing the chip-level bonding process were subsequently analyzed for conductivity.

Please refer to FIGS. 1A to IC: FIG. 1A is a schematic view for the situation before the first bonding substrate S10 and the second bonding substrate S20 undergo a bonding process. It can be seen that a first passivation layer 10 is formed on one end of the first bonding substrate S10 and a second passivation layer 20 is formed on one end of the second bonding substrate S20. The first passivation layer 10 has a first bonding face 101 and the second passivation layer 20 has a second bonding face 201. Before the first bonding substrate S10 and the second bonding substrate S20 start to the bonding process, the first passivation layer 10 and the second passivation layer 20 should be put face to face. Upon starting the bonding process, the first bonding substrate S10, the second bonding substrate S20, the first passivation layer 10 and the second passivation layer 20 will diffuse mutually. Finally, a semiconductor bonding structure P1 as shown in FIG. 1B or a semiconductor bonding structure P2 as shown in FIG. 1C will be formed.

Wherein the bonding layer 11 is formed by the first passivation layer 10 and the second passivation layer 20 and a diffusion of the third metal of the first bonding substrate S10 and the third metal of the second bonding substrate S20, and therefore the bonding layer 11 comprises the third metal and the material of the passivation layer.

Both of the semiconductor bonding structures P1 and P2 have the first bonding substrate S10, the second bonding substrate S20 and the bonding layer 11 therebetween. The bonding layer 11 comprises the first zone 111 and the second zone 112. The main difference between the semiconductor bonding structures P1 and P2 is their different arrangements of the first zone 11 and the second zone 112 in the bonding layer 11.

Figure 1B:
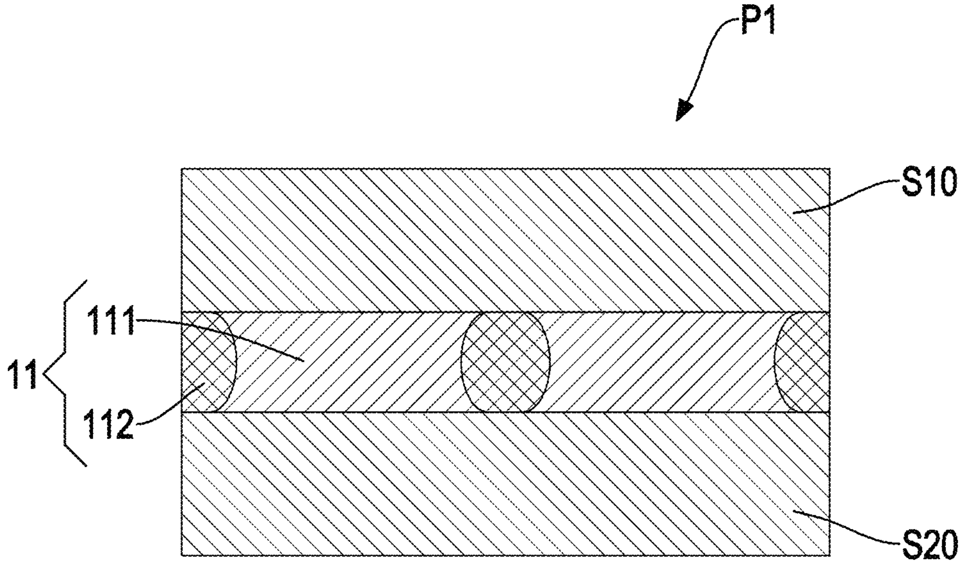
FIG. 1I is a schematic view of one embodiment of the semiconductor bonding structure of the instant disclosure.
FIG. 1C is a schematic view of another embodiment of the semiconductor bonding structure of the instant disclosure.
FIG. 1D is a schematic view of still another embodiment of the semiconductor bonding structure of the instant disclosure.
Figure 1C:
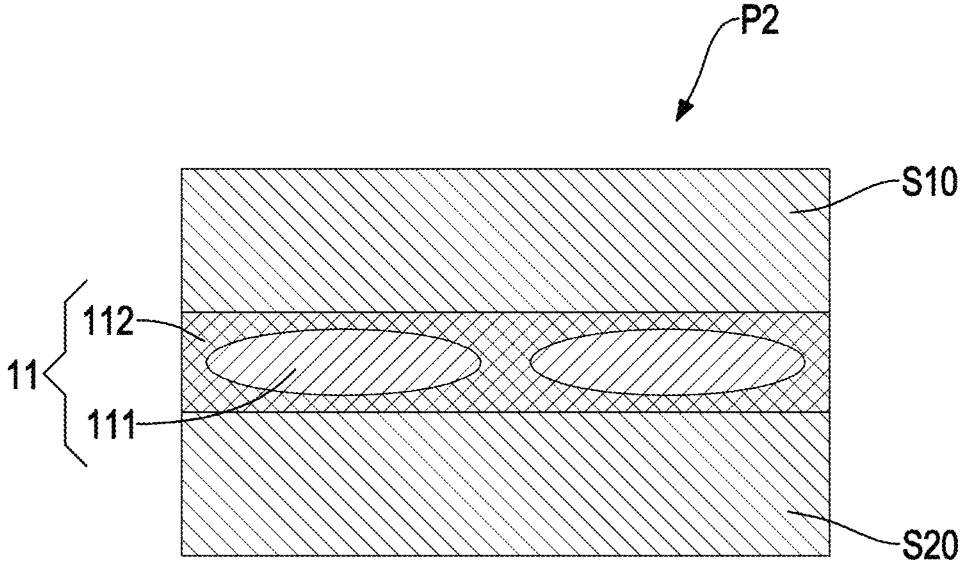
Figure 1D:
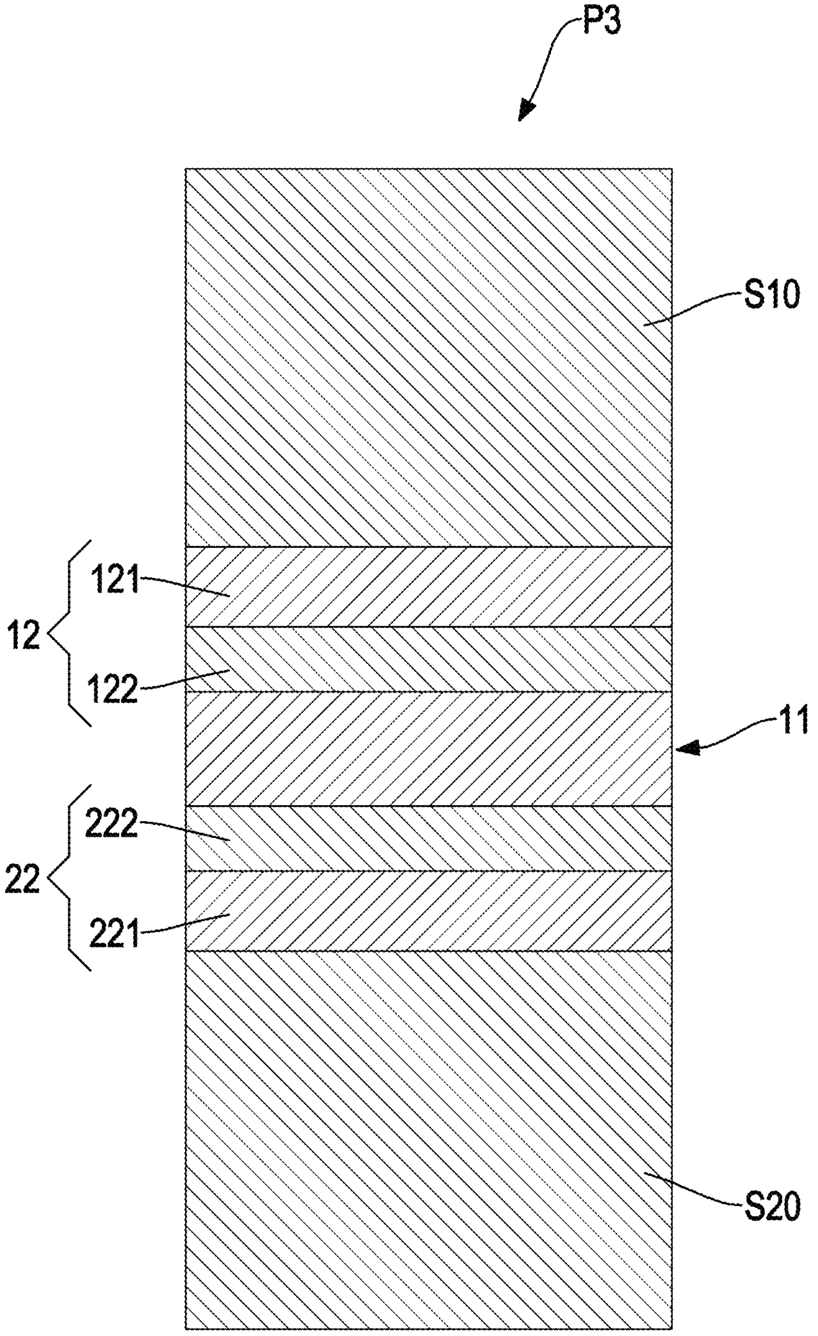

In one embodiment as shown in FIG. 1B, the first zone 111 and the second zone 112 in the bonding layer 11 of the semiconductor bonding structure P1 are arranged in sequence; that is, the second zone 112, the first zone 111, the second zone 112, the first zone 111 and the second zone 112 are arranged side by side.

In another embodiment as shown in FIG. 1C, the second zone 112 surrounds the first zone 111 in the bonding layer 11 of the semiconductor bonding structure P2. In still another embodiment, the semiconductor bonding structure may have a structure like the semiconductor bonding structure P3. It means that the semiconductor bonding structure may further comprise a first reaction layer 12 and a second reaction layer 22 in addition to the first bonding substrate S10, the second bonding substrate S20 and the bonding layer 11 therebetween. The first reaction layer 12 is between the bonding layer 11 and the first bonding substrate S10, and the second reaction layer 22 is between the bonding layer 11 and the second bonding substrate S20.

The first reaction layer 12 comprises a first sublayer 121 and a second sublayer 122: the first sublayer 121 of the first reaction layer 12 is joined to the first bonding substrate S10, and the second sublayer 122 of the first reaction layer 12 is joined to the bonding layer 11.

The second reaction layer 22 comprises a first sublayer 221 and a second sublayer 222; the first sublayer 221 of the second reaction layer 22 is joined to the second bonding substrate S20, and the second sublayer 222 of the second reaction layer 22 is joined to the bonding layer 11. Wherein the bonding layer 11 of the semiconductor bonding structure P3 also comprises the first and second zones, and the first and second zones can be arranged in a side-by-side manner as shown in FIG. 1B or a manner as shown in FIG. 1C in which the second zone 112 surrounds the first zone 111.

Analysis 7: Type and Crystallization States of Bonding Layers

The sections of the five samples in each of the semiconductor bonding structures undergoing the wafer-level bonding process were analyzed to observe their images by a TEM (model: JEM-2010F, manufacturer: JEOL); wherein the five samples were taken from the upper, middle, lower, left and right in the bonded wafer.

The topography of the bonding layer in each sample was observed, and the elemental contents of the aforementioned bonding layer were analyzed by an EDS. The content of Cu element was used to define the distribution of the first zone and the second zone. That is, the Cu content in the first zone was less than 50 at %, the Cu content of the second zone was greater than or equal to 50 at %, thereby defining the type of the bonding layer. The type of the bonding layer, the crystallization states, and the maximum and minimum values of the contents of Cu element obtained from analyzing the first zone and the second zone in the bonding layer of each sample were recorded in Table 3.

Analysis 8: Elemental Contents of Reaction Layers

The sections of the five samples in each of the semiconductor bonding structures undergoing the wafer-level bonding process were analyzed to observe their images by a TEM (model: JEM-2010F, manufacturer: JEOL); wherein the five samples were taken from the upper, middle, lower, left and right in the bonded wafer.

The elemental contents of the reaction layers in each sample were analyzed by an EDS. The content of Cu element was used to define the first and second sublayers of the first reaction layer and the first and second sublayers of the second reaction layer. That is, the Cu contents in those first sublayers were larger than 50 at %, the Cu contents of the second sublayers were less than or equal to 50 at % (i.e. the materials of the passivation layers accounting for more than 50 at %). The maximum and minimum values obtained from analyzing the contents of Cu element in the first sublayers and the second sublayers of each sample were recorded in Table 3. Since the first bonding substrate and the second bonding substrate were the same, the first sublayer and the second sublayer recorded in Table 3 did not differentiate between the first reaction layer and the second reaction layer.

Analysis 9: Bonding Quality Analysis

Each of the semiconductor bonding structures undergoing the wafer-level bonding process was analyzed by a scanning acoustic tomography (SAT; model: FS30011, manufacturer: Hitachi) to interpret the bonding quality of bonding layers. The overall bonding quality can be judged by the color depth and distribution thereof in the SAT images. Wherein, the black area represents solid joints. Therefore, the more the black areas, the better the bonding quality.

Figure 6A:
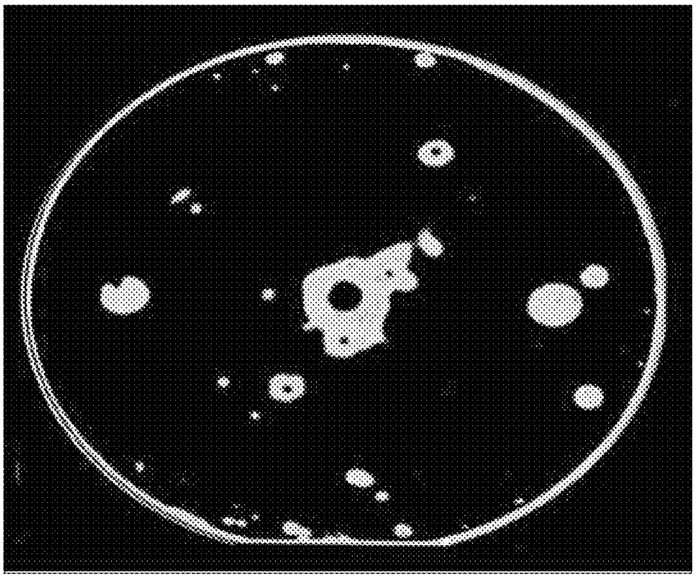
FIG. 6A is a SAT image of the section of the semiconductor bonding structure of Example 1 A obtained from a bonding process at 150° C.
Figure 6B:
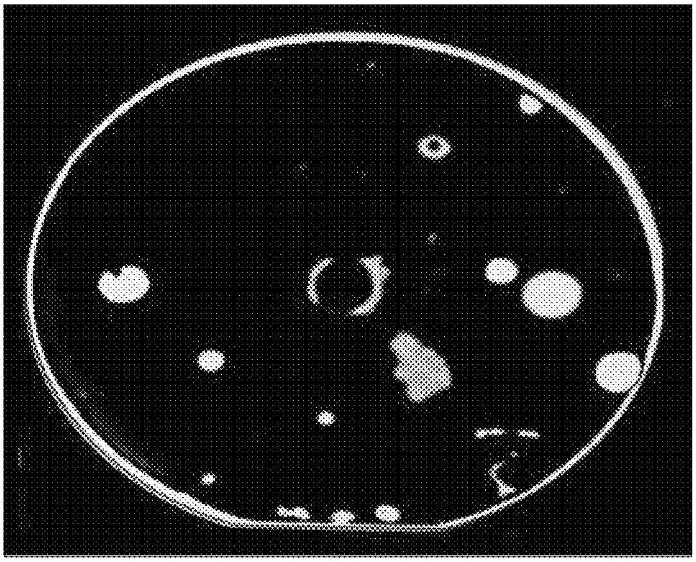
Figure 7A:
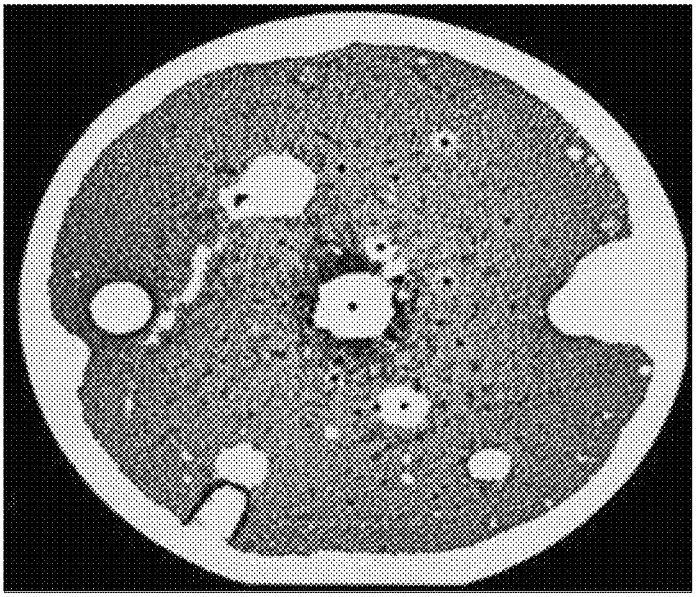
FIG. 7A is a SAT image of the section of the semiconductor bonding structure of Comparative Example 4A obtained from a bonding process at 150° C.
Figure 7B:
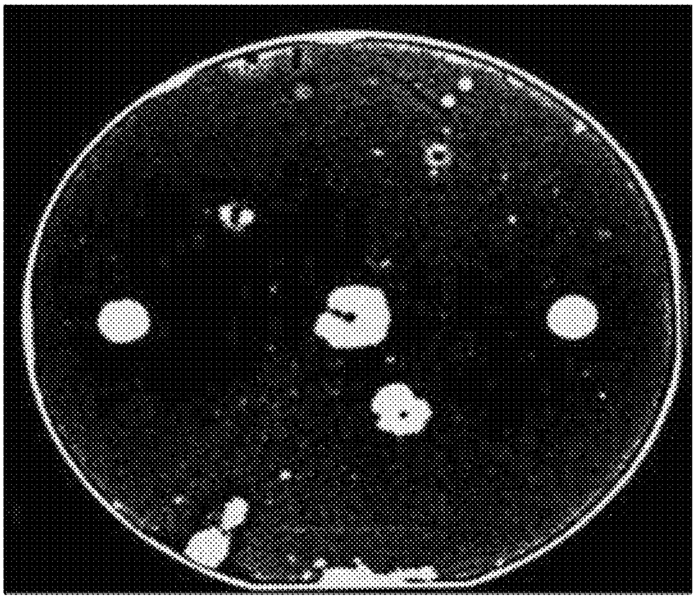
FIG. 7B is a SAT image of the section of the semiconductor bonding structure of Reference Example 2A obtained from a bonding process at 200° C.

Wherein, at a bonding temperature of 150° C., a wafer-level bonding process was completed through a set of the passivation layers E1 of Example 1 to form the semiconductor bonding structure E1 A of Example 1A, and a section from the semiconductor bonding structure E1 A was observed by the SAT, and the resulting image as shown in FIG. 6A. Besides, at a bonding temperature of 200° C., a wafer-level bonding process was also completed through a set of the passivation layers E1 of Example 1 to form the semiconductor bonding structure R1A of Reference Example 1A. and a section from the semiconductor bonding structure R1A was observed by the SAT, and the resulting image as shown in FIG. 6B. Similarly, at a bonding temperature of 150° C., a wafer-level bonding process was completed through a set of the passivation layers C4 of Comparative Example 4 to form the semiconductor bonding structure C4A of Comparative Example C4A, and a section from the semiconductor bonding structure C4A was observed by the SAT, and the resulting image as shown in FIG. 7A. Besides, at a bonding temperature of 200° C., a wafer-level bonding process was also completed through a set of the passivation layers C4 of Comparative Example 4 to form the semiconductor bonding structure R2A of Reference Example 2A, and a section from the semiconductor bonding structure R2A was observed by the SAT, and the resulting image as shown in FIG. 7B.

Figure 8:
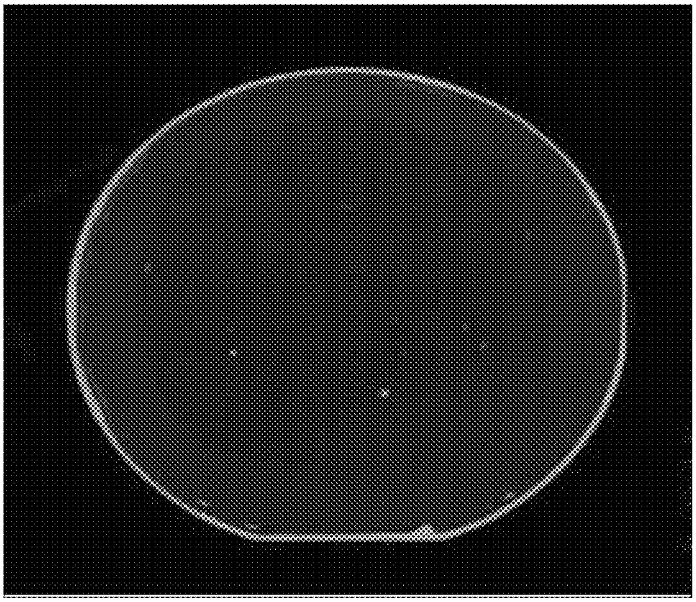
FIG. 8 is a SAT image of the section of the semiconductor bonding structure of Example 3A obtained from a bonding process at 150° C.
Figure 9:
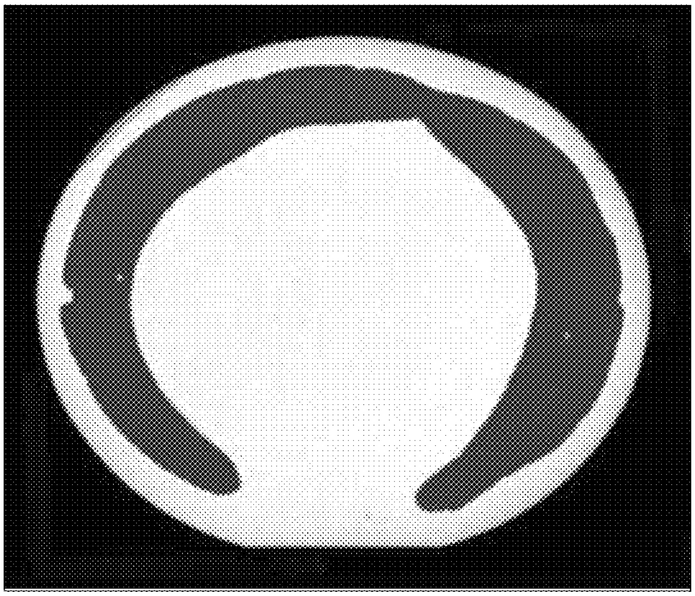
FIG. 9 is a SAT image of the section of the semiconductor bonding structure of Comparative Example 3A obtained from a bonding process at 150° C.

In addition, at a bonding temperature of 150° C., a wafer-level bonding process was completed through a set of the passivation layers E3 of Example 3 to form the semiconductor bonding structure E3A of Example 3A, and a section from the semiconductor bonding structure E3A was observed by the SAT, and the resulting image as shown in FIG. 8, At a bonding temperature of 150° C., a wafer-level bonding process was completed through a set of the passivation layers C3 of Comparative Example 3 to form the semiconductor bonding structure C3A of Comparative Example C3A, and a section from the semiconductor bonding structure C3A was observed by the SAT, and the resulting image as shown in FIG. 9.

Analysis 10: Bonding Strength Analysis

Each of the semiconductor bonding structures undergoing the wafer-level bonding process was subjected to a tensile test by a die pull tester (model: Model-FTN1-13A). The results were recorded in Table 3.

Analysis 11: Conductivity Analysis

First, test keys with the Kelvin structure were formed after the bonding process by pre-designing patterns on the upper and lower chips. Then, by a semiconductor parameter analyzer (model: Agilent 4156C), the conductivity analyses for each of the semiconductor bonding structures obtained from the chip-level bonding process were performed, so as to provide the information of the specific contact resistance after the upper and lower chips bonded.

Table 3: No. of the semiconductor bonding structures of Examples 1A to 6A and Comparative Examples 1 A to 4A, main component of the passivation layers, the type of arrangement of the first and second zones in the bonding layer, crystallization states of bonding layers, the Cu content in the first and second zones, the Cu content in the first and second sublayers, temperature/duration of the wafer-level bonding process, bonding strength, temperature/duration of the chip-level bonding process and specific contact resistance

| No. | E1A | E2A | E3A | E4A | E5A |
|---|---|---|---|---|---|
| main component of the passivation layers | Ag | | Au | Pt | Pd |
| type of arrangement of the first and second zones | the second zone surrounds the first zone | side-by-side in sequence | side-by-side in sequence | side-by-side in sequence | side-by-side in sequence |
| crystallization states of bonding layers | polycrystalline structure | polycrystalline structure | polycrystalline structure | polycrystalline structure | polycrystalline structure |
| Cu content in the first zone (at %) | 25 to 30 | 17 to 21 | 30 to 36 | 30 to 35 | 42 to 48 |
| Cu content in the second zone (at %) | 85 to 90 | 60 to 65 | 52 to 57 | 65 to 70 | 85 to 90 |
| Cu content in the first sublayer (at %) | 98 to 99 | 98 to 100 | 72 to 76 | 75 to 80 | 90 to 95 |
| Cu content in the second sublayer (at %) | 42 to 47 | 42 to 47 | 21 to 48 | 40 to 46 | 50 to 60 |
| Temp./duration of wafer-level bonding process | 150° C./50 min | 150° C./50 min | 120° C./50 min | 180° C./50 min | 150° C./50 min |
| bonding strength (MPa) | 7.97 | 1.08 | 1.48 | 1.14 | 5.4 |
| Temp./duration of chip-level bonding process | 180° C./60 sec | 180° C./60 sec | 100° C./180 sec | 180° C./200 sec | 150° C./180 sec |
| specific contact resistance (Ω · $cm^2$) | $5.23*10^{-7}$ | $1.98*10^{-7}$ | $1.00*10^{-7}$ | $7.00*10^{-7}$ | $1.00*10^{-8}$ |

| No. | E6A | C1A | C2A | C3A | C4A |
|---|---|---|---|---|---|
| main component of the passivation layers | 98Ag—1Pd—1Cu | Ag | Ni | Ti | 99.5Ag—0.5Zn |
| type of arrangement of the first and second zones | side-by-side in sequence | Unable to bonding | Unable to bonding | Forming a single-layer structure in which Cu, Ti, and O coexist | Unable to bonding |
| crystallization states of bonding layers | polycrystalline structure | | | amorphous structure | |
| Cu content in the first zone (at %) | 28 to 35 | | | — | |
| Cu content in the second zone (at %) | 90 to 95 | | | 81 to 86 | |
| Cu content in the first sublayer (at %) | 98 to 99 | | | 95 to 99 | |
| Cu content in the second sublayer (at %) | 60 to 64 | | | 12 to 20 | |
| Temp./duration of wafer-level bonding process | 150° C./50 min | | | 200° C./50 min | |
| bonding strength (MPa) | 1.67 | | | 2.6 | |
| Temp./duration of chip-level bonding process | 180° C./60 sec | | | 180° C./50 sec | |
| specific contact resistance (Ω · $cm^2$) | $2.08*10^{-7}$ | | | $7.00*10^{4}$ | |

Discussion of Results

As shown in Tables 2 and 3, the passivation layers of Examples 1 to 6 had the specific component(s), the specific O content range and a polycrystalline structure, therefore, there was no amorphous oxide formed in the surface of the passivation layer; in addition, the surface roughness of the passivation layers was small so that the passivation layers formed on the bonding substrates could prevent excessive diffusion of metal atoms of the bonding substrates before the bonding process; but the metal atoms of the bonding substrate could easily diffuse from the grain boundary of the passivation layer to the surface thereof during the bonding process so that the resulting bonding structure could have a sufficiently high bonding strength. Moreover, with the passivation layers of Examples 1 to 6, the semiconductor bonding structures of Examples 1A to 6A could achieve the bonding process under an environment at a low temperature less than 200° C. to prevent fast oxidation of the bonding substrates and/or the passivation layers during the bonding process. As a result, all of the semiconductor bonding structures had a high bonding strength and high conductivity.

In contrast, the O contents of the passivation layers of Comparative Examples 1, 3 and 4 were not controlled and were too high, and severe oxidation was even occurred. Therefore, the bonding process may need to be carried out at a higher temperature and even may not be able to finish.

In addition, from the results in Tables 1 and 2, by controlling the component of the sputtering target and the range of the O content in the sputtering target, the passivation layer of the instant disclosure can be more easily controlled to simultaneously have the following technical features to achieve the above-mentioned technical effects: (I) the passivation layer should include the specific first metal and/or second metal; (II) the O content range in the surface of the passivation layer should be controlled; (II) the content range of the material of the bonding substrate in the surface of the passivation layer should be controlled; and (IV) the passivation layer has a polycrystalline structure. Especially, when the material of the sputtering target is an easily oxidized material such as Ag metal with high purity, Al metal with high purity, Cu metal with high purity or the alloys thereof, the manufacturing process of sputtering target in the instant disclosure indeed achieve to lower the O content thereof by using Ar gas to remove O gas.

Figure 2A:
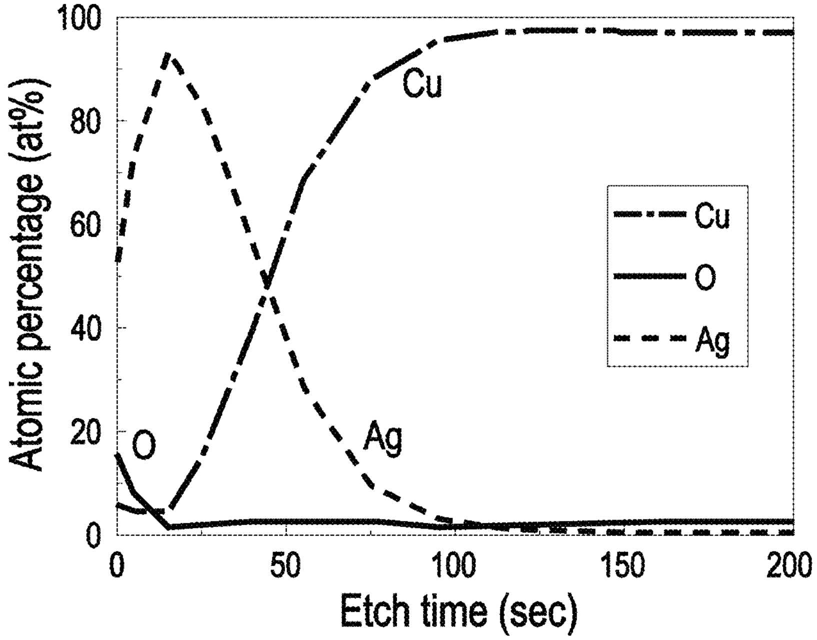
FIG. 2A is an XPS spectrum for element analysis from measuring the passivation layer of Example 1 before annealing.
Figure 2B:
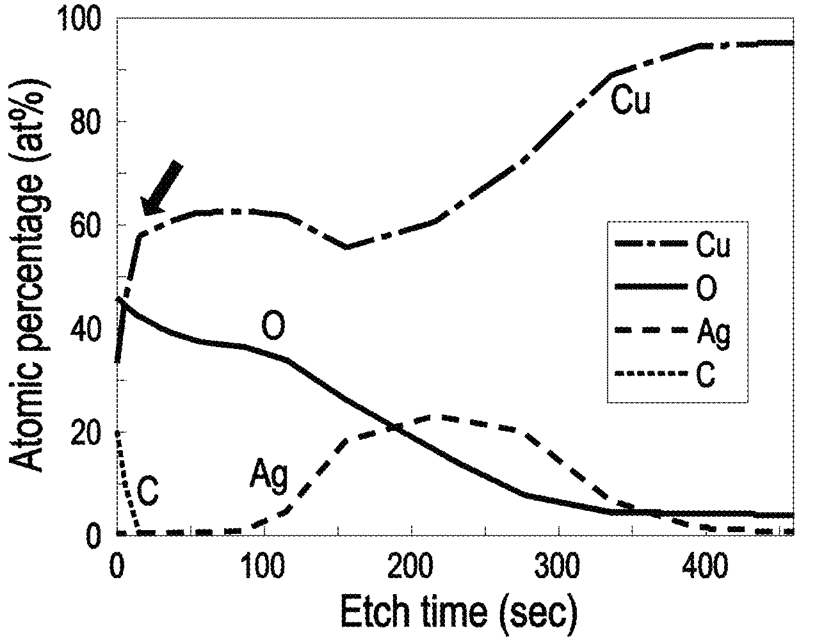
FIG. 2B is an XPS spectrum for element analysis from measuring the passivation layer of Example 1 after annealing.
Figure 3A:
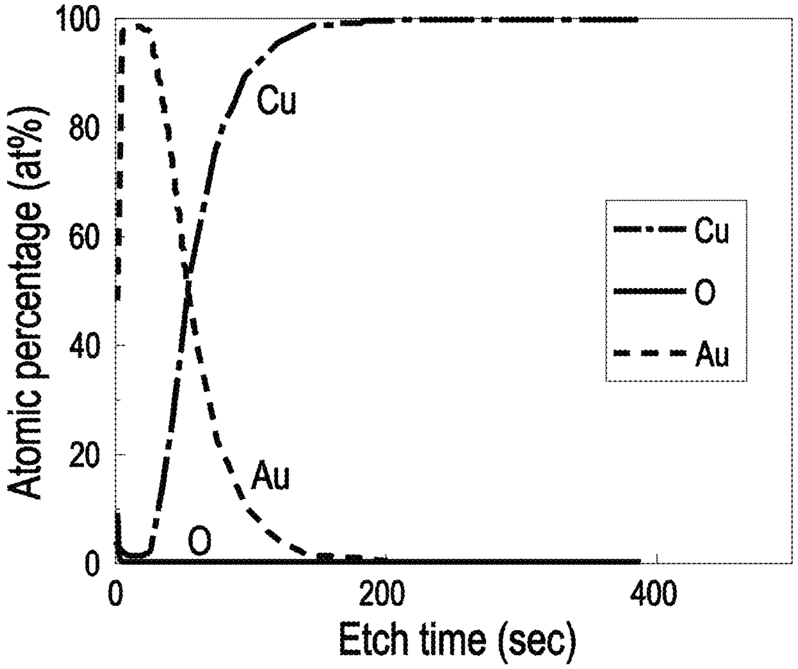
FIG. 3A is an XPS spectrum for element analysis from measuring the passivation layer of Example 3 before annealing.
Figure 3B:
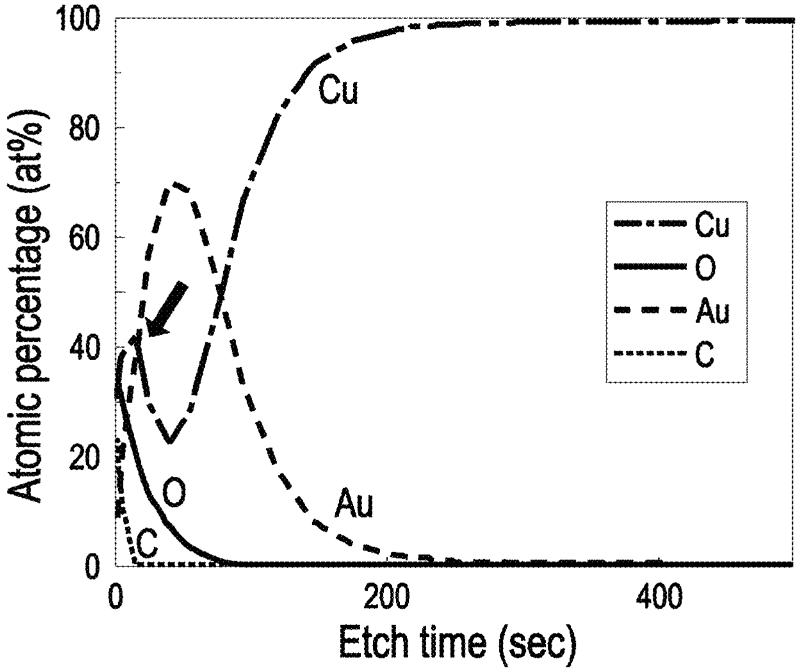
FIG. 3B is an XPS spectrum for element analysis from measuring the passivation layer of Example 3 after annealing.
Figure 4A:
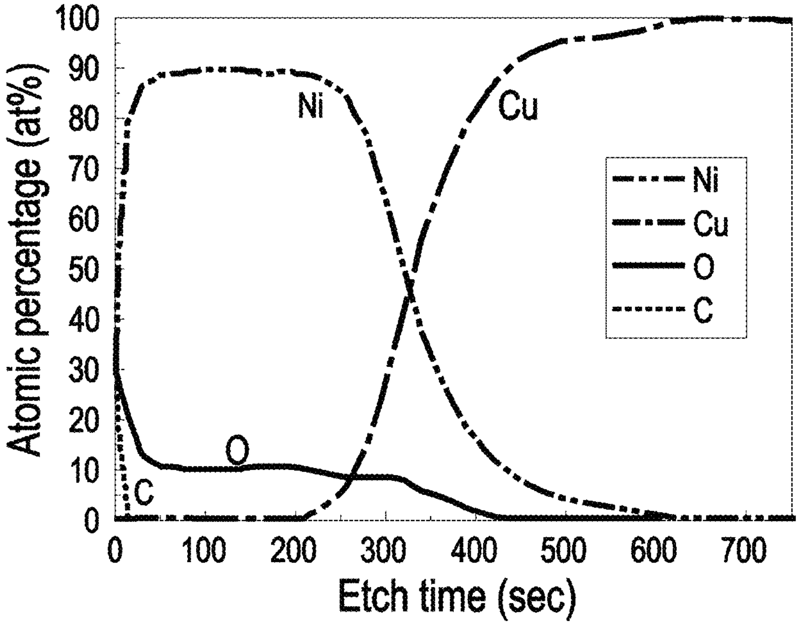
FIG. 4A is an XPS spectrum for element analysis from measuring the passivation layer of Comparative Example 2 before annealing.
Figure 4B:
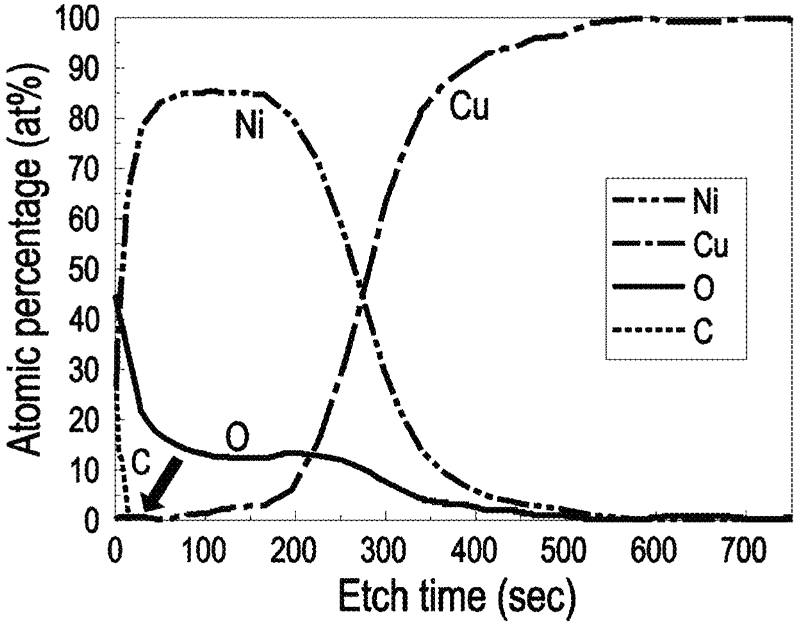
FIG. 4B is an XPS spectrum for element analysis from measuring the passivation layer of Comparative Example 2 after annealing.
Figure 5A:
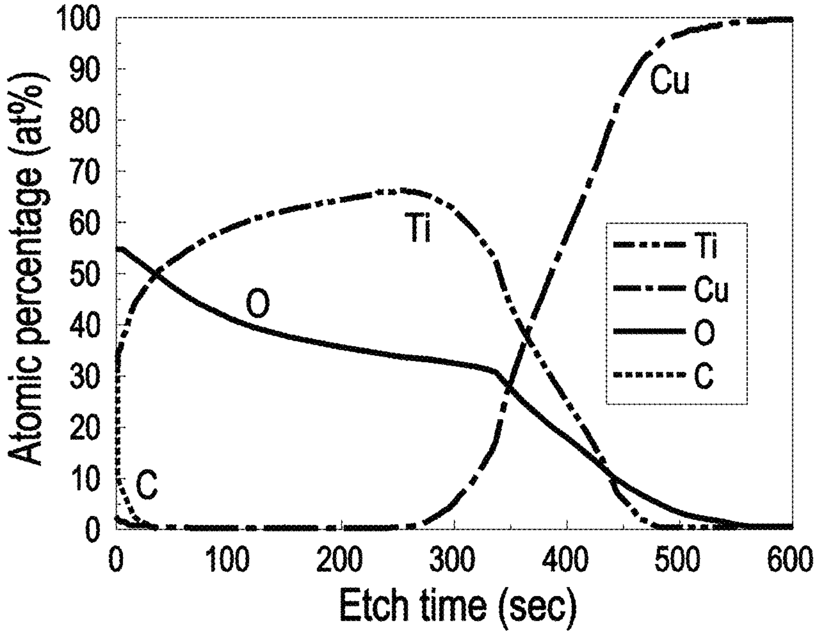
FIG. 5A is an XPS spectrum for element analysis from measuring the passivation layer of Comparative Example 3 before annealing.
Figure 5B:
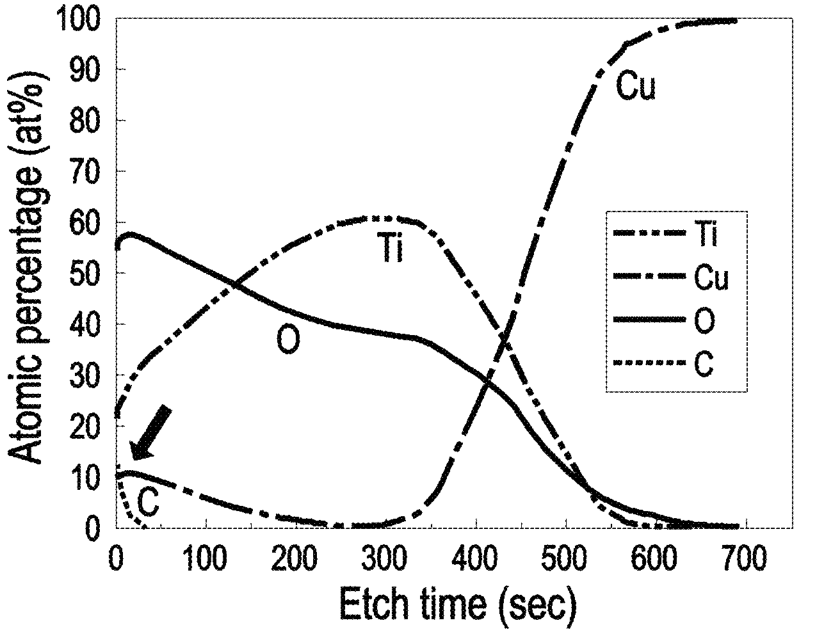
FIG. 5B is an XPS spectrum for element analysis from measuring the passivation layer of Comparative Example 3 after annealing.

Further, from a comparison between the passivation layer of Example 1 in FIG. 2A and FIG. 2B and from a comparison between the passivation of Example 3 in FIG. 3A and FIG. 3B, it can be seen that after the passivation layer underwent the anneal process, the Cu content in the surface of the passivation layer (i.e. where an arrow in the XPS spectra pointed at) increased significantly. It proves that the passivation layer of the instant disclosure indeed increases the diffusion amount of metal atoms of the bonding substrate after the anneal process. In contrast, from a comparison between the passivation layer of Comparative Example 2 in FIG. 4A and FIG. 4B as well as a comparison between the passivation layer of Comparative Example 3 in FIG. 5A and FIG. 5B, it can be seen that after the anneal process, the Cu content of the passivation layers C2 and C3 of Comparative Examples 2 and 3 almost remained unchanged within the depth with etch time of 300 seconds. It can be understood that the metal atoms of the bonding substrate did not diffuse to the passivation layer, so the resulting bonding quality was poor.

From the comparison among FIGS. 6A and 8 with FIGS. 7A and 9, when the bonding temperature was 150° C., most area obviously exhibited black in the SAT images of the sections of the semiconductor bonding structures of instant disclosure, indicating that solid-joint area was large; it demonstrated that the semiconductor bonding structure of the instant disclosure had an excellent bonding quality. In contrast, when the bonding temperature was 150° C., most area exhibited white/light in the SAT images of the sections of the semiconductor bonding structures of Comparative Examples 4A and 3A, indicating that there were many non-joining areas. It meant that the bonding structures were almost unable to be formed under a low temperature environment. Further, from the comparison between FIGS. 6A and 6B, the semiconductor bonding structures, which were obtained by using the passivation layer of Example 1 to complete the bonding process, exhibited the similar bonding quality regardless of whether the bonding process was conducted at a temperature of 150° C. or 200° C. It can be seen that the semiconductor bonding structure of the instant disclosure indeed can be formed at a low temperature and it can have high bonding quality.

In addition, as shown in Table 3, the semiconductor bonding structure C3A obtained by the wafer-level bonding process seemed to have good bonding strength. However, from the measured characteristic contact resistance of the semiconductor bonding structure C3A obtained by the chip-level bonding process, it showed that the passivation layer of Comparative Example 3 was possibly seriously oxidized so that it took a long bonding duration (50 minutes) to complete the chip-level bonding process, and the resulting semiconductor bonding structure had a poor conductivity.

In summary, the quality of the passivation layer of the instant disclosure can be improved by properly controlling the choice of the material, the range of content and the range of the material of the bonding substrate contained in the passivation layer and having a polycrystalline crystal structure in the passivation layer. Furthermore, the resulting semiconductor bonding structure can have a high bonding strength and high conductivity, thereby enhancing the utilization value to the semiconductor manufacturing field.

The above embodiments are only examples for convenience of explanation, but these embodiments are not intended to limit the scope of the instant disclosure. Any changes or modifications completed without departing from the disclosed content of instant disclosure should be included within the scope of the instant disclosure.

What is claimed is:

1. A passivation layer for forming a semiconductor bonding structure, wherein the passivation layer is formed on a bonding substrate, and a material of the passivation layer comprises a first metal, a second metal or a combination thereof;

wherein the first metal is selected from at least one of the group consisting of gold, silver, platinum, ruthenium, and aluminum;

the second metal is selected from at least one of the group consisting of copper and palladium;

wherein a material of the bonding substrate comprises a third metal which is selected from at least one of the group consisting of gold, aluminum, copper, cobalt, and ruthenium;

wherein based on a total atom number of a surface of the passivation layer, an oxygen content of the surface of the passivation layer is less than 30 at %, and a content of the third metal of the surface of the passivation layer is less than or equal to 10 at %; and the passivation layer has a polycrystalline structure.

2. The passivation layer as claimed in claim 1, wherein based on the total atom number of the surface of the passivation layer, the oxygen content of the surface of the passivation layer is less than or equal to 20 at %.

3. The passivation layer as claimed in claim 1, wherein the surface of the passivation layer has an arithmetic average roughness of less than or equal to 3 nm.

4. The passivation layer as claimed in claim 1, wherein the passivation layer is in a form of an island-like film or a continuous film.

5. The passivation layer as claimed in claim 1, wherein after the passivation layer undergoes an anneal process, the content of the third metal of the surface of the passivation layer is larger than 20 at %; wherein a temperature of the anneal process is larger than or equal to 70° C. and smaller than 200° C., and a duration of the anneal process is larger than 30 minutes and smaller than or equal to 60 minutes.

6. The passivation layer as claimed in claim 5, wherein after the passivation layer undergoes the anneal process, the content of the third metal of the surface of the passivation layer is larger than or equal to 40 at %; wherein the temperature of the anneal process is larger than or equal to 70° C. and smaller than or equal to 150° C.

7. The passivation layer as claimed in claim 1, wherein the passivation layer is formed on the bonding substrate by a sputtering target through a sputtering process; wherein the sputtering target comprises the first metal, the second metal or a combination thereof, and an oxygen content in the sputtering target is less than 10 parts per million.

8. A semiconductor bonding structure, comprising:

a first bonding substrate;

a second bonding substrate; and a bonding layer located between the first bonding substrate and the second bonding substrate;

wherein a material of the first bonding substrate and a material of the second bonding substrate independently comprise the third metal which is selected from at least one of the group consisting of gold, aluminum, copper, cobalt, and ruthenium;

wherein the bonding layer is formed by the passivation layer as claimed in claim 1 and a diffusion of the third metal of the first bonding substrate and the third metal of the second bonding substrate, and the bonding layer comprises the third metal and the material of the passivation layer;

wherein the bonding layer comprises a first zone and a second zone;

based on a total atom number of the first zone, a content of the third metal in the first zone is less than 50 at %;

based on a total atom number of the second zone, a content of the third metal in the second zone is larger than or equal to 50 at %.

9. The semiconductor bonding structure as claimed in claim 8, wherein an arrangement of the first zone and the second zone is that the first and second zones are arranged side by side in sequence or that the second zone surrounds the first zone.

10. The semiconductor bonding structure as claimed in claim 8, wherein a volume of the first zone is larger than a volume of the second zone.

11. The semiconductor bonding structure as claimed in claim 8, wherein the semiconductor bonding structure further comprises a first reaction layer and a second reaction layer; the first reaction layer is between the bonding layer and the first bonding substrate, and the second reaction layer is between the bonding layer and the second bonding substrate;

wherein the first reaction layer and the second reaction layer respectively comprise a first sublayer and a second sublayer;

the first sublayer of the first reaction layer is joined to the first bonding substrate, and the second sublayer of the first reaction layer is joined to the bonding layer;

the first sublayer of the second reaction layer is joined to the second bonding substrate, and the second sublayer of the second reaction layer is joined to the bonding layer;

based on a total atom number of each of the first sublayers, a content of the third metal in each of the first sublayers is larger than 50 at %;

based on a total atom number of each of the second sublayers, a content of the material of the passivation layer in each of the second sublayers is larger than 50 at %.

12. The semiconductor bonding structure as claimed in claim 8, wherein the passivation layer to form the bonding layer is obtained by a sputtering target through a sputtering process; wherein the sputtering target comprises the first metal, the second metal or a combination thereof, and an oxygen content in the sputtering target is less than 10 parts per million.

13. A semiconductor bonding process, comprising steps of:

step (A): preparing a first bonding substrate and a second bonding substrate; wherein a material of the first bonding substrate and a material of the second bonding substrate independently comprise a third metal which is selected from at least one of the group consisting of gold, aluminum, copper, cobalt, and ruthenium;

step (B): forming a first passivation layer on an end face of the first bonding substrate and forming a second passivation layer on an end face of the second bonding substrate; wherein the first passivation layer and the second passivation layer are respectively the passivation layer as claimed in claim 1, and the outer surface of the first passivation layer refers to a first bonding face and the outer surface of the second passivation layer refers to a second bonding face;

step (C): putting the first passivation layer and the second passivation layer in a face-to-face manner to form a laminated structure in a bonding environment; and step (D): applying a bonding force to the laminated structure in the bonding environment so that the first bonding face and the second bonding face are joined together, so as to obtain the semiconductor bonding structure as claimed in claim 8; wherein a bonding temperature of the bonding environment is larger than or equal to 70° C. and smaller than 200° C., and a duration of applying the bonding temperature is smaller than or equal to 60 minutes.

14. The semiconductor bonding process as claimed in claim 13, wherein in the Step (B), the first passivation layer and the second passivation layer are respectively formed on the end face of the first bonding substrate and on the end face of the second bonding substrate by a sputtering target through a sputtering process;

wherein the sputtering target comprises the first metal, the second metal or a combination thereof, and an oxygen content in the sputtering target is less than 10 parts per million.

15. A sputtering target used to make a passivation layer for forming a bonding layer, comprising a first metal, a second metal or a combination thereof;

wherein an oxygen content in the sputtering target is less than 10 parts per million;

wherein the first metal is selected from at least one of the group consisting of gold, silver, platinum, ruthenium, and aluminum;

the second metal is selected from at least one of the group consisting of copper and palladium;

wherein when the sputtering target comprises the first metal and the second metal, based on a total weight of the sputtering target, a content of the second metal is not larger than 10 wt %.

16. The sputtering target as claimed in claim 15, wherein the second metal in the sputtering target has a maximum concentration deviation smaller than 0.2 at %.

* * * * *